United States Patent
Han et al.

(10) Patent No.: US 9,948,301 B2
(45) Date of Patent: Apr. 17, 2018

(54) HYBRID CHIP COMPRISING HYBRID CONNECTOR

(71) Applicant: Samsung Electronics Co., Ltd., Gyeonggi-do (KR)

(72) Inventors: Sangwook Han, Seoul (KR); Thomas Byunghak Cho, Gyeonggi-do (KR); Jaehyun Lim, Seoul (KR); Sung-Jun Lee, Gyeonggi-do (KR); Joonhee Lee, Gyeonggi-do (KR); Jongwon Choi, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 15/211,459

(22) Filed: Jul. 15, 2016

(65) Prior Publication Data
US 2017/0026041 A1    Jan. 26, 2017

(30) Foreign Application Priority Data

Jul. 24, 2014    (KR) .......................... 10-2015-0105120
Jun. 3, 2016    (KR) .......................... 10-2016-0069584

(51) Int. Cl.
*H03L 5/00*        (2006.01)
*H03K 19/0175*    (2006.01)
*H01L 27/02*      (2006.01)

(52) U.S. Cl.
CPC . *H03K 19/017509* (2013.01); *H01L 27/0248* (2013.01)

(58) Field of Classification Search
CPC .............................................. H03K 19/017509
See application file for complete search history.

(56) References Cited

U.S. PATENT DOCUMENTS

| | | |
|---|---|---|
| 6,691,269 B2 | 2/2004 | Sunter |
| 7,401,279 B2 | 7/2008 | Sumita et al. |
| 7,765,445 B2 | 7/2010 | Eckelman et al. |
| 8,458,542 B2 | 6/2013 | Shimizume et al. |
| 8,713,390 B2 | 4/2014 | Whetsel |
| 2012/0269005 A1 | 10/2012 | Yoon |
| 2014/0237308 A1* | 8/2014 | Kujala ............... G01R 31/3172 714/726 |

FOREIGN PATENT DOCUMENTS

| | | |
|---|---|---|
| KR | 10-2006-0055595 | 5/2006 |
| KR | 10-2012-0119532 | 10/2012 |
| KR | 10-2014-0002163 | 1/2014 |

* cited by examiner

*Primary Examiner* — Daniel Puentes
(74) *Attorney, Agent, or Firm* — The Farrell Law Firm, P.C.

(57) ABSTRACT

An integrated circuit (IC), a method of testing the IC, and a method of manufacturing the IC are provided. The IC includes analog circuitry, digital circuitry, at least one first connector, and a switching unit operatively coupled with the at least one first connector and configured to, if a first signal is received, couple the analog circuitry and the at least one first connector, and, if a second signal is received, couple the digital circuitry and the at least one first connector.

18 Claims, 8 Drawing Sheets

HYBRID CHIP COMPRISING HYBRID CONNECTOR

PRIORITY

This application claims priority under 35 U.S.C. § 119(a) to Korean Patent Applications filed on Jul. 24, 2015 and Jun. 3, 2016 in the Korean Intellectual Property Office and assigned Serial Nos. 10-2015-0105120 and 10-2016-0069584, respectively, the entire disclosures of each of which are incorporated herein by reference.

BACKGROUND

1. Field of the Disclosure

The present disclosure relates generally to a hybrid integrated circuit (IC), or chip, including a hybrid connector, and more particularly, to a hybrid chip, including a hybrid connector, for connecting with not only analog circuitry but also digital circuitry.

2. Description of the Related Art

To generate a more accurate signal, current chips require more connectors. However, such chips need to be smaller for their installation in an electronic device having various functions. Thus, it is demanded to effectively utilize a limited number of connectors.

SUMMARY

An aspect of the present disclosure is to provide a hybrid connector for connecting with not only analog circuitry but also digital circuitry.

According to one aspect of the present disclosure, an IC is provided. The IC includes analog circuitry, digital circuitry, at least one first connector, and a switching unit operatively coupled with the at least one first connector and configured to, if a first signal is received, couple the analog circuitry and the at least one first connector, and, if a second signal is received, couple the digital circuitry and the at least one first connector.

According to another aspect of the present disclosure, a method of testing an integrated circuit (IC) is provided. The method includes generating a clock signal and a test signal for testing the integrated circuit, where the integrated circuit is comprised of: analog circuitry; digital circuitry; at least one first connector; and a switching unit operatively coupled with the at least one first connector and configured to: if a first signal is received, couple the analog circuitry and the at least one first connector, and if a second signal is received, couple the digital circuitry and the at least one first connector.

According to another aspect of the present disclosure, a method of manufacturing an integrated circuit (IC) is provided. The method includes forming analog circuitry as part of a wafer or package; forming digital circuitry as part of the wafer or package; forming at least one first connector as part of the wafer or package; and forming a switching unit operatively coupled with the at least one first connector and configured to: if a first signal is received, couple the analog circuitry and the at least one first connector, and if a second signal is received, couple the digital circuitry and the at least one first connector.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION OF EMBODIMENTS OF THE PRESENT DISCLOSURE

Figure 1:
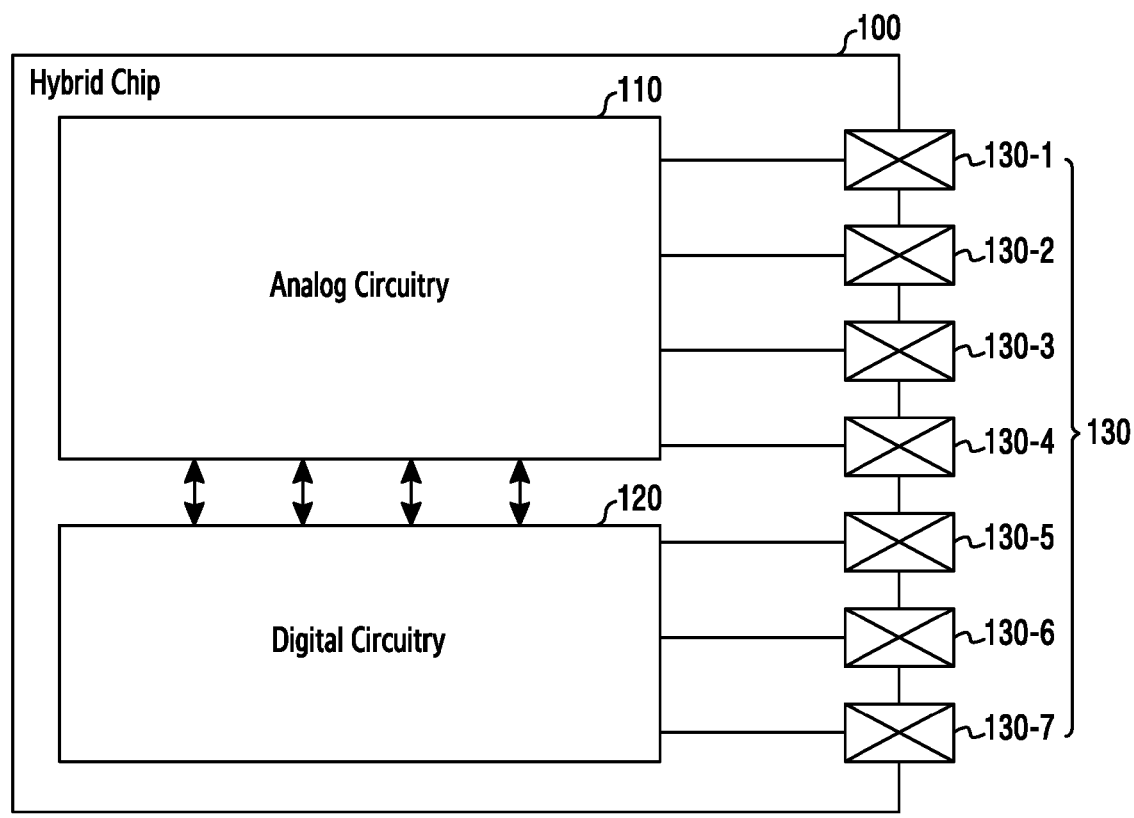
FIG. 1 is a block diagram of a hybrid chip including analog circuitry and digital circuitry.

The terms used herein are for the purpose of describing embodiments of the present disclosure only and are not intended to be limiting. As used herein, singular forms are intended to include plural forms as well, unless the context clearly indicates otherwise. The terms used herein, have the same meanings as terms that are generally understood by those skilled in the art, as long as the terms are not differently defined. It should be understood that terms defined in a generally-used dictionary have meanings consistent with those of terms in the related technology. Unless otherwise defined, they are not intended to be interpreted in an ideally or excessively formal manner. Throughout the drawings, like reference numerals will be understood to refer to like parts, components and structures In embodiments of the present disclosure described below, a hardware approach is described as an example. However, since the embodiments of the present disclosure include both hardware and software, the present disclosure does not exclude a software-based approach.

A hybrid chip may be a chip including analog circuitry and digital circuitry. To install a hybrid chip in an electronic device having various functions, the hybrid chip must be designed in a limited size and thus includes a limited number of connectors. To control or calibrate an analog signal, recent hybrid chips demand the digital circuitry to operate at a higher rate.

Mostly, to test digital circuitry, there are design for test (DFT) techniques of high reliability such as scan and memory built in self test (MBIST). To test digital circuitry using the high-reliability DFT, a great number of (e.g., 10 or so) digital connectors are required.

To process an analog signal, a hybrid chip requires connectors over a reference number for the analog circuitry. Accordingly, a hybrid chip includes a small number of (e.g., three or four) connectors for the digital circuitry. As a result, a current hybrid chip tests its digital circuitry through a simplified manner. For a digital circuitry of a hybrid chip, its design is demanded to secure digital connectors over a certain number.

Hence, an embodiment of the present disclosure provides a hybrid chip including a hybrid connector which is used for analog circuitry in a first mode (e.g., a functional mode) and for digital circuitry in a second mode (e.g., a test mode). By means of a hybrid connector, a hybrid chip may provide more accurate analog signals. Also, using a hybrid connector, a hybrid chip may check an error of digital circuitry more accurately. Further, a hybrid chip including a hybrid connector uses resources (e.g., electrostatic discharge (ESD), supply voltage) for a conventional hybrid chip and thus achieves high compatibility with existing electronic devices.

FIG. 1 is a block diagram of a hybrid chip including analog circuitry and digital circuitry.

Referring to FIG. 1, a hybrid chip 100 may include analog circuitry 110, digital circuitry 120, and a plurality of connectors 130 (e.g., 130-1 through 130-7).

The analog circuitry 110 may be circuitry for processing an analog signal. For example, to process an analog signal, the analog circuitry 110 may include various phase-locked loops (PLLs), various amplifiers, various filters, and the like.

The digital circuitry 120 may be circuitry for controlling or calibrating the analog circuitry 110. For example, the digital circuitry 120 may include various logic gates (e.g., an AND gate, an OR gate, a NOR gate, an Exclusive-OR (XOR) gate, etc.). The digital circuitry 120 may control PLLs, amplifiers, and filters of the analog circuitry 110 using various logic gates.

The plurality of connectors 130 may be elements for interconnecting the analog circuitry 110 or the digital circuitry 120 with at least one electronic device. The at least one electronic device may include various elements operatively or functionally coupled with the hybrid chip 100. For example, the at least one electronic device may be another chip external to the hybrid chip 100.

The plurality of connectors 130 may each be referred to as a pad, a lead, a ball, a pin, and the like.

The connectors 130-1 through 130-4 of the plurality of connectors 130 may be connected to the analog circuitry 110. The connectors 130-1 through 130-4 may each provide a signal received from the at least one electronic device to the analog circuitry 110. The connectors 130-1 through 130-4 may each provide a signal received from the analog circuitry 110 to the at least one electronic device.

The connectors 130-5 through 130-7 of the plurality of connectors 130 may each provide a signal received from the at least one electronic device to the digital circuitry 120. The connectors 130-5 through 130-7 may each provide a signal received from the digital circuitry 120 to the at least one electronic device.

As such, the hybrid chip 100 includes the four connectors 130-1 through 130-4 for the analog circuitry 110 and the three connectors 130-5 through 130-7 for the digital circuitry 120. Due to the small number of the connectors for the digital circuitry 120, the digital circuitry 120 of the hybrid chip 100 may be tested in a simplified manner. As a result, the hybrid chip 100 may not guarantee a required performance.

Figure 2:
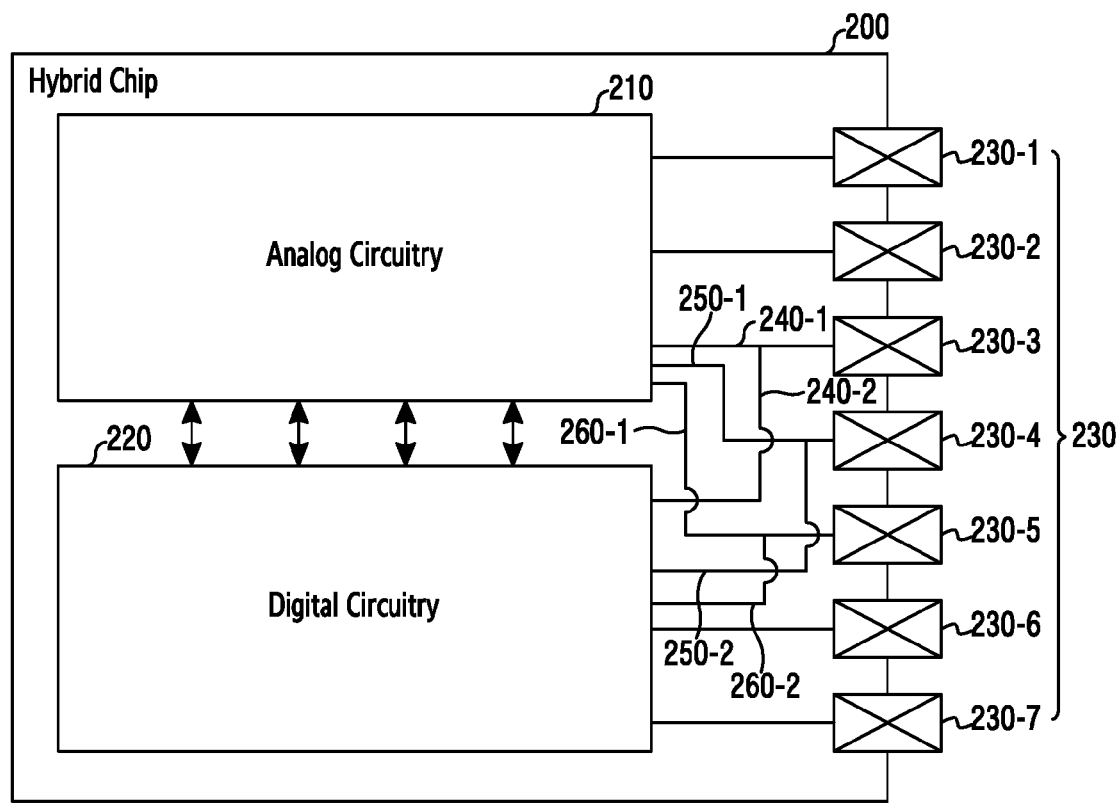
FIG. 2 is a block diagram of a hybrid chip including hybrid connectors according to an embodiment of the present disclosure.

FIG. 2 is a block diagram of a hybrid chip 200 including hybrid connectors according to an embodiment of the present disclosure.

Referring to FIG. 2, the hybrid chip 200 may include analog circuitry 210, digital circuitry 220, a plurality of connectors 230 (e.g., 230-1 through 230-7), an analog path 240-1, an analog path 250-1, an analog path 260-1, a digital path 240-2, a digital path 250-2, and a digital path 260-2.

The analog circuitry 210 may be circuitry for processing an analog signal. For example, to process an analog signal, the analog circuitry 210 may include various PLLs, various amplifiers, various filters, and the like. In an embodiment of the present disclosure, the analog circuitry 210 may process a signal transmitted from or received at a user equipment including the hybrid chip 200. For example, the user equipment may include an evolved node B (eNB), a base station, a mobile station, and so one. The analog circuitry 210 may phase-lock, amplify, or filter a signal transmitted from a user equipment. The analog circuitry 210 may phase-lock, amplify, or filter a signal received at a user equipment.

The digital circuitry 220 may be circuitry for controlling or calibrating the analog circuitry 210. For example, the digital circuitry 220 may include various logic gates. The digital circuitry 220 may control PLLs, amplifiers, and filters of the analog circuitry 210 using various logic gates. The digital circuitry 220 may assist the analog circuitry 210 in processing more accurately a signal transmitted from or received at a user equipment.

The plurality of connectors 230 may be devices for interconnecting the analog circuitry 210 or the digital circuitry 220 with at least one electronic device. The plurality of connectors 230 may each be referred to as a pad, a lead, a ball, a pin, and so on.

The plurality of connectors 230 may include analog connectors 230-1 and 230-2, hybrid connectors 230-3, 230-4, and 230-5, and digital connectors 230-6 and 230-7.

The analog connectors 230-1 and 230-2 may each provide a signal received from at least one electronic device to the analog circuitry 210. The analog connectors 230-1 and 230-2 may each provide a signal received from the analog circuitry 210 to at least one electronic device.

The digital connectors 230-6 and 230-7 may each provide a signal received from at least one electronic device to the digital circuitry 220. The digital connectors 230-6 and 230-7 may each provide a signal received from the digital circuitry 220 to at least one electronic device.

The hybrid connectors 230-3, 230-4, and 230-5 may be used as analog connectors according to an operation mode of the hybrid chip 200. For example, when the hybrid chip 200 operates in a first mode (e.g., a mode for processing an analog signal), the hybrid connector 230-3 may be connected to the analog circuitry 210 using the analog path 240-1. For example, when the hybrid chip 200 operates in the first mode, the hybrid connector 230-4 may be connected to the analog circuitry 210 using the analog path 250-1. For example, when the hybrid chip 200 operates in the first mode, the hybrid connector 230-5 may be connected to the analog circuitry 210 using the analog path 260-1.

The hybrid connectors 230-3, 230-4, and 230-5 may be used as digital connectors according to the operation mode of the hybrid chip 200. For example, when the hybrid chip 200 operates in a second mode (e.g., a mode for checking an error of the digital circuitry 220), the hybrid connector 230-3 may be connected to the digital circuitry 220 using the digital path 240-2. For example, when the hybrid chip 200 operates in the second mode, the hybrid connector 230-4 may be connected to the digital circuitry 220 using the digital path 250-2. For example, when the hybrid chip 200 operates in the second mode, the hybrid connector 230-5 may be connected to the digital circuitry 220 using the digital path 260-2.

As above, the hybrid chip 200 may use five connectors for the analog circuitry 210 and five connectors for the digital circuitry 200. The hybrid chip 200 may process a signal more accurately than the hybrid chip 100. This is because the hybrid chip 200 may use more analog connectors than the hybrid chip 100. Also, the hybrid chip 200 may guarantee less error than the hybrid chip 100. Unlike the hybrid chip 100, which tests the digital circuitry 120 in a simplified manner due to the limited number of the digital connectors, the hybrid chip 200 may secure more digital connectors than the hybrid chip 100. The hybrid chip 200 may check an error of the digital circuitry 220 using a high-reliability testing method (e.g., scan, MBIST, etc.) using more digital connectors than the hybrid chip 100.

Figure 3:
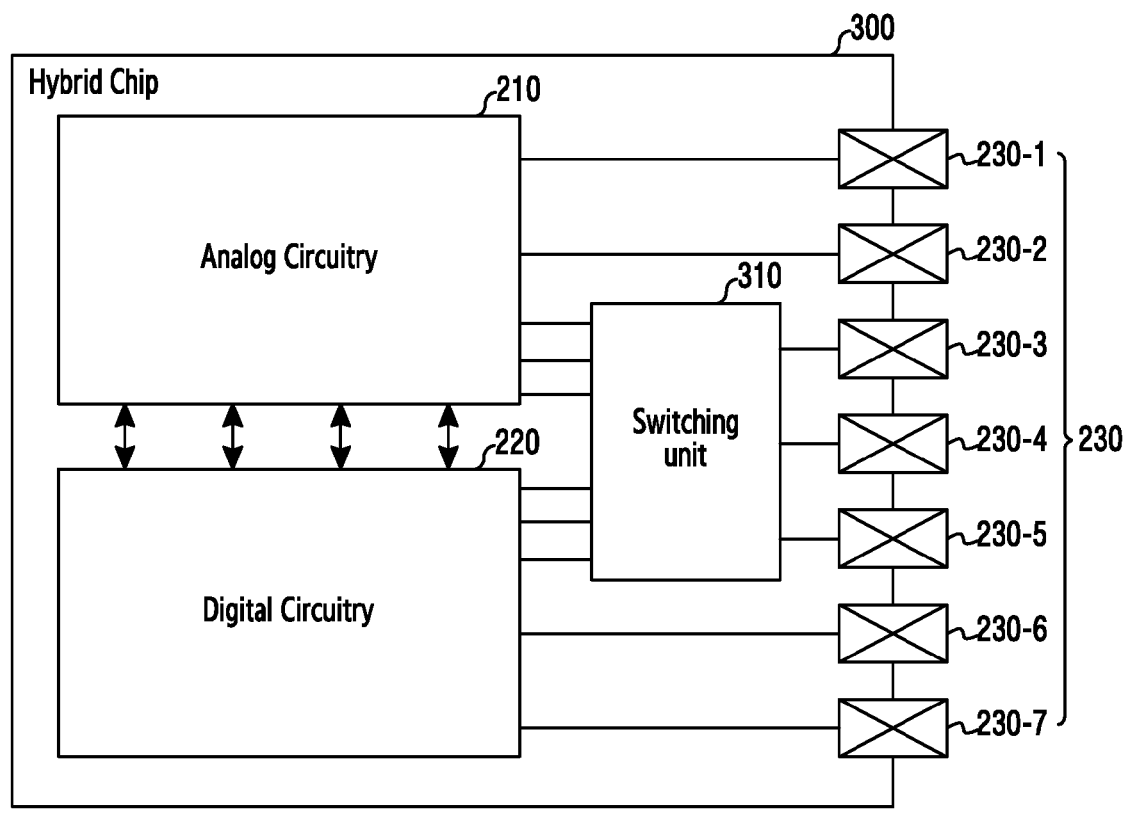
FIG. 3 is a block diagram of a functional structure of a hybrid chip including a switching unit according to an embodiment of the present disclosure.

FIG. 3 is a block diagram of a hybrid chip 300 including a switching unit 310 according to an embodiment of the present disclosure. The hybrid chip 300 may be included in the hybrid chip 200 of FIG. 2.

Referring to FIG. 3, the hybrid chip 300 may include the analog circuitry 210, the digital circuitry 220, a plurality of connectors 230 (e.g., connectors 230-1 through 230-7), and a switching unit 310.

The analog circuitry 210 may include two to five input/output paths. Two of the five input/output paths may be connected to the analog connectors 230-1 and 230-2 respectively. The other three of the five input/output paths may be connected to the switching unit 310.

The analog circuitry 210 may send a signal to at least one electronic device through the analog connectors 230-1 and 230-2. The analog circuitry 210 may receive a signal from at least one electronic device through the analog connectors 230-1 and 230-2.

The analog circuitry 210 may generate a signal to send to at least one electronic device. For example, the analog circuitry 210 may generate a signal by amplifying, phase-locking, or filtering its input signal.

The analog circuitry 210 may process a signal received from at least one electronic device. For example, the analog circuitry 210 may amplify, phase-lock, or filter the received signal.

The digital circuitry 220 may include two to five input/output paths. Two of the five input/output paths may be connected to the digital connectors 230-6 and 230-7 respectively. The other three of the five input/output paths may be connected to the switching unit 310.

The digital circuitry 220 may send a signal to at least one electronic device through the digital connectors 230-6 and 230-7. The digital circuitry 220 may receive a signal from at least one electronic device through the digital connectors 230-6 and 230-7.

The digital circuitry 220 may process a signal to send to at least one electronic device. For example, the digital circuitry 220 may process its input signal using its components (e.g., a NAND gate, an XOR gate, etc.).

The digital circuitry 220 may process a signal received from at least one electronic device.

In an embodiment of the present disclosure, the digital circuitry 220 may be operatively coupled with the analog circuitry 210. In this case, the digital circuitry 220 may serve as circuitry for controlling the analog circuitry 210. For example, the digital circuitry 220 may generate a signal for controlling the analog circuitry 210. For example, the digital circuitry 220 may process its input signal and thus generate a signal for controlling the analog circuitry 210.

The analog connectors 230-1 and 230-2 may each be a dedicated connector for the analog circuitry 210. The digital connectors 230-6 and 230-7 may each be a dedicated connector for the digital circuitry 220.

The hybrid connectors 230-3, 230-4, and 230-5 may each be connected to the switching unit 310.

The hybrid connectors 230-3, 230-4, and 230-5 may each send a signal to the analog circuitry 210 through the switching unit 310. The hybrid connectors 230-3, 230-4, and 230-5 may each send a signal to the digital circuitry 220 through the switching unit 310.

The hybrid connectors 230-3, 230-4, and 230-5 may each receive a signal from the switching unit 310. The hybrid connectors 230-3, 230-4, and 230-5 may each forward the received signal to at least one electronic device.

The switching unit 310 may be connected to the analog circuitry 210 through an analog path (the three analog paths between the analog circuitry 210 and the switching unit 310 in FIG. 3). The switching unit 310 may be connected to the hybrid connectors 230-3, 230-4, and 230-5.

According to a control signal, the switching unit 310 may interconnect the analog circuitry 210 with the hybrid connectors 230-3, 230-4, and 230-5. The control signal may be a signal for connecting the switching unit 310 with either the analog circuitry 210 or the digital circuitry 220. The control signal may be determined according to an operation mode of the hybrid chip 300. In an embodiment of the present disclosure, the control signal may be received from a controller of a user equipment including the hybrid chip 300 in order to set the operation mode of the hybrid chip 210. In an embodiment of the present disclosure, the control signal may be received from an input unit of a user equipment including the hybrid chip 300 in order to set the operation mode of the hybrid chip 210. In an embodiment of the present disclosure, the control signal may be input from a user in order to set the operation mode of the hybrid chip 210.

For example, when receiving a first signal for setting the operation mode of the hybrid chip 210 to a functional mode, the switching unit 310 may interconnect the analog circuitry 210 with the hybrid connectors 230-3, 230-4, and 230-5. For example, when receiving a second signal for setting the operation mode of the hybrid chip 210 to a test mode, the switching unit 310 may interconnect the digital circuitry 220 with the hybrid connectors 230-3, 230-4, and 230-5. Herein, the switching unit 310 interconnects the analog circuitry 210 with all of the hybrid connectors 230-3, 230-4, and 230-5, and interconnects the digital circuitry 220 with all of the hybrid connectors 230-3, 230-4, and 230-5. Notably, the switching unit 310 may interconnect some of the hybrid connectors 230-3, 230-4, and 230-5 with the analog circuitry 210 and the rest with the digital circuitry 220.

Unlike a single connector (e.g., which multiplexes a plurality of direct current (DC) signals) for multiple purposes in a chip, the hybrid connectors 230-3, 230-4, and 230-5 of FIG. 2 and FIG. 3, respectively, may be connected with the analog circuitry 210 or the digital circuitry 220 according to the operation mode. The hybrid chip 300 including the hybrid connectors 230-3, 230-4, and 230-5 may adaptively secure the connectors according to the operation mode. Hence, the hybrid chip 300 including the hybrid connectors 230-3, 230-4, and 230-5 may achieve wider coverage than a chip without the hybrid connectors 230-3, 230-4, and 230-5.

Figure 4:
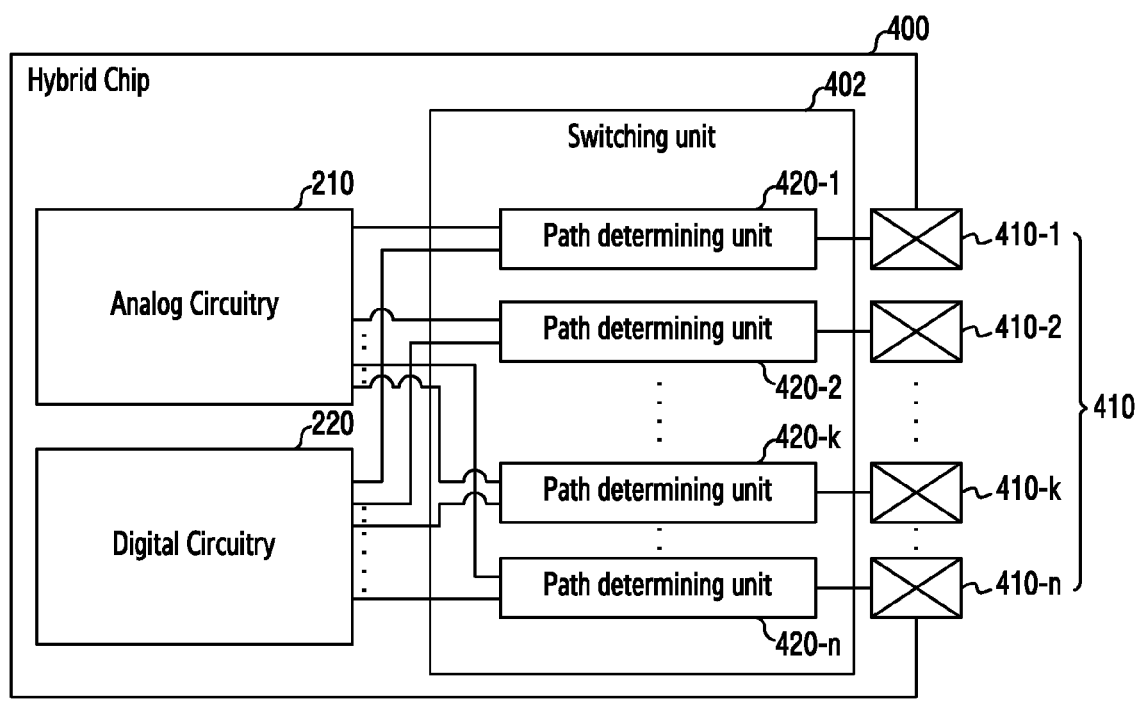
FIG. 4 is a block diagram of a functional structure of a hybrid chip including a switching unit including a plurality of path determining units according to an embodiment of the present disclosure.

FIG. 4 is a block diagram of a hybrid chip 400 including a switching unit including a plurality of path determining units according to an embodiment of the present disclosure. The hybrid chip 400 may be included in the hybrid chips 200 and 300 of FIG. 2 or FIG. 3, respectively.

Referring to FIG. 4, the hybrid chip 400 may include the analog circuitry 210, the digital circuitry 220, a switching unit 402, a plurality of hybrid connectors 410 (e.g., 410-1 through 410-n), and a plurality of path determining units 420-1 through 420-n.

The analog circuitry 210 may be connected with the path determining units 420-1 through 420-n.

To send a signal to at least one electronic device, the analog circuitry 210 may send the signal to all or some of the hybrid connectors 410 through all or some of the path determining units 420-1 through 420-n.

The analog circuitry 210 may receive a signal from at least one electronic device through all or some of the path determining units 420-1 through 420-n. A signal from at least one electronic device may be received through all or some of the hybrid connectors 410. A signal received through all or some of the hybrid connectors 410 may be provided to the analog circuitry 210 through all or some of the path determining units 420-1 through 420-n.

The analog circuitry 210 may send and receive signals using none to all of the hybrid connectors 410 according to an operation mode of the hybrid chip 400, and send and receive signals using up to n-ary hybrid connectors.

The digital circuitry 220 may be connected with the path determining units 420-1 through 420-n. To send a signal to at least one electronic device, the digital circuitry 220 may send the signal to all or some of the hybrid connectors 410 through all or some of the path determining units 420-1 through 420-n.

The digital circuitry 220 may receive a signal from at least one electronic device through all or some of the path determining units 420-1 through 420-n. The signal from at least one electronic device may be received through all or some of the hybrid connectors 410. The signal received through all or some of the hybrid connectors 410 may be provided to the digital circuitry 220 through all or some of the path determining units 420-1 through 420-n.

The digital circuitry 220 may send and receive signals using none to all of the hybrid connectors 410 according to the operation mode of the hybrid chip 400, and send and receive signals using up to n-ary hybrid connectors.

The switching unit 402 may include the path determining units 420-1 through 420-n. For the path determining units 420-1 through 420-n, the switching unit 402 may receive a control signal indicating the operation mode of the hybrid chip 400.

In an embodiment of the present disclosure, according to a control signal, the switching unit 402 may determine which circuitry (e.g., the analog circuitry 210 or the digital circuitry 220) to connect with the path determining units 420-1 through 420-n. For example, when the control signal instructs to connect the hybrid connector 410-k with the analog circuitry 210 (i.e., to connect the path determining unit 420-k corresponding to the hybrid connector 410-k with the analog circuitry 210), the switching unit 402 may interconnect the path determining unit 420-k with the analog circuitry 210. For example, when the control signal instructs to connect the hybrid connector 410-k with the digital circuitry 220, the switching unit 400 may interconnect the path determining unit 420-k with the digital circuitry 220.

In an embodiment of the present disclosure, the path determining units 420-1 through 420-n, rather than the switching unit 402, each may receive the control signal indicating the operation mode of the hybrid chip 400. When receiving the control signal, the path determining units 420-1 through 420-n may determine which circuitry to connect with them. For example, when the control signal directs to connect the hybrid connector 410-k with the analog circuitry 210, the path determining unit 420-k corresponding to the hybrid connector 410-k may be connected to the analog circuitry 210. For example, when the control signal instructs to connect the hybrid connector 410-k with the digital circuitry 220, the path determining unit 420-k corresponding to the hybrid connector 410-k may be connected to the digital circuitry 220.

The path determining units 420-1 through 420-n may be connected with the hybrid connectors 410-1 through 410-n respectively.

The path determining units 420-1 through 420-n may be connected with the analog circuitry 210 or the digital circuitry 220 according to the operation mode of the hybrid chip 400.

As above, the hybrid chip 400 may adaptively adjust the number of connectors for the analog circuitry 210 and the number of connectors for the digital circuitry 220. For example, when the analog circuitry 210 alone must operate, the hybrid chip 400 may adjust the number of connectors for the analog circuitry 210 according to a task of the analog circuitry 210. For example, when the digital circuitry 220 alone must operate, the hybrid chip 400 may adjust the number of the connectors for the digital circuitry 220 according to a task of the digital circuitry 220. For example, when the task of the analog circuitry 210 has a higher priority than the task of the digital circuitry 220, the hybrid chip 400 may assign more connectors to the analog circuitry 210 than the digital circuitry 220. For example, when the task of the digital circuitry 220 has a higher priority than the task of the analog circuitry 210, the hybrid chip 400 may assign more connectors to the digital circuitry 220 than the analog circuitry 210.

Figure 5:
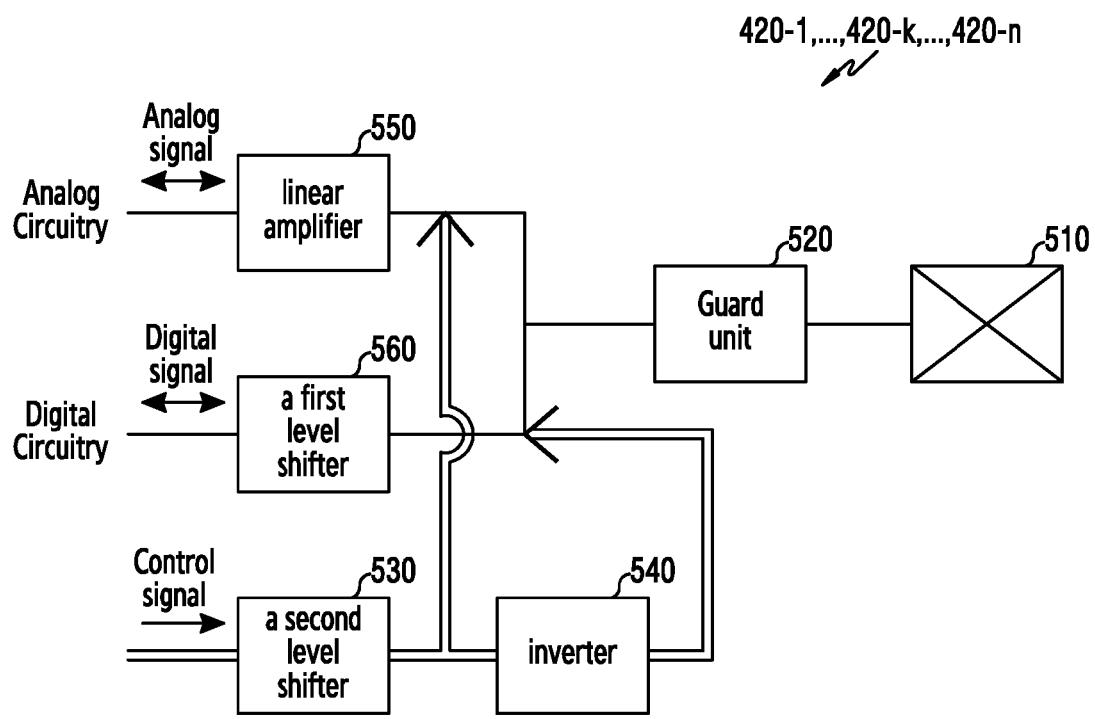
FIG. 5 is a block diagram of a path determining unit according to an embodiment of the present disclosure.

FIG. 5 is a block diagram of a path determining unit 420-1 to 420-n according to an embodiment of the present disclosure. The path determining unit 420-1 to 420-n may be included in one of the path determining unit 420-1 through 420-n of FIG. 4.

Referring to FIG. 5, one of the path determining units 420-1 through 420-n may include a hybrid connector 510, a guard unit 520, a second level shifter 530, an inverter 540, a linear amplifier 550, and a first level shifter 560.

The hybrid connector 510 may serve the same function as one of the hybrid connector 230-3, 230-4, and 230-5 of FIG. 2 or one of the hybrid connectors 410 of FIG. 4.

The guard unit 520 may be connected with the hybrid connector 510. The guard unit 520 may be connected with the linear amplifier 550. The guard unit 520 may be connected with the first level shifter 560.

The guard unit 520 may protect the hybrid chip 400 or the path determining unit 420-1 to 420-n. The guard unit 520 may block ESD from flowing into an output signal of analog circuitry (e.g., the analog circuitry 210). The guard unit 520 may block ESD from flowing into an output signal of digital circuitry (e.g., the digital circuitry 210).

The guard unit 520 may include a clamp diode including two diodes.

The second level shifter 530 may be connected to the inverter 540.

The second level shifter 530 may receive a control signal. The control signal may indicate the operation mode of the hybrid chip 400. In an embodiment of the present disclosure, the control signal may be received from a controller of a user equipment including the hybrid chip 400. The control signal may be received from an input unit of a user equipment including the hybrid chip 400 according to a user input. The control signal may be generated by processing the signal received through an input unit in the switching unit 402 of FIG. 4.

The second level shifter 530 may level-shift a received control signal. In an embodiment of the present disclosure, when a control signal is received at a voltage of 5V, the second level shifter 530 may generate a control signal of a voltage of 1.8V by level-shifting the control signal. When a control signal of low voltage is received, the second level shifter 530 may generate a high-voltage control signal by level-shifting the control signal.

The second level shifter 530 may provide the level-shifted control signal to a path between the analog circuitry 210 and the hybrid connector 510. The level-shifted control signal may indicate whether to activate the path between the analog circuitry 210 and the hybrid connector 510. In other words, the level-shifted control signal may indicate whether the hybrid connector 510 is used as the connector for the analog circuitry 210. For example, the level-shifted control signal of a voltage may activate the path between the analog circuitry 210 and the hybrid connector 510. For example, the level-shifted control signal without a voltage may deactivate the path between the analog circuitry and the hybrid connector 510. In this case, the level-shifted control signal of the voltage activates the path between the analog circuitry 210 and the hybrid connector 510. The level-shifted control signal with no voltage may activate the path between the analog circuitry 210 and the hybrid connector 510.

To indicate whether to activate the path between the digital circuitry 220 and the hybrid connector 510, the second level shifter 530 may provide the level-shifted control signal to the inverter 540.

The inverter 540 may be connected with the second level shifter 530.

The inverter 540 may invert the level-shifted control signal received from the second level shifter 530 and thus generate the inverted control signal.

The inverter 540 may provide the inverted control signal to a path between the digital circuitry 220 and the hybrid connector 510. The inverted control signal may indicate whether to activate the path between the digital circuitry 220 and the hybrid connector 510. In other words, the inverted control signal may indicate whether the hybrid connector 510 is used as a connector for the digital circuitry 220.

The linear amplifier 550 may be connected with the analog circuitry 210. The linear amplifier 550 may be connected with the guard unit 520.

The linear amplifier 550 may amplify a signal received through the hybrid connector 510 and thus generate an amplified signal. The linear amplifier 550 may amplify a signal received from the analog circuitry 210 and thus generate an amplified signal. In an embodiment of the present disclosure, the linear amplifier 550 may be replaced by an amplifier of a different type from FIG. 5.

The linear amplifier 550 may provide an amplified signal to the analog circuitry 210. The linear amplifier 550 may provide an amplified signal to the hybrid connector 510.

The linear amplifier 550 may operate when the control signal activates an analog path (the path between the analog circuitry 210 and the hybrid connector 510).

The first level shifter 560 may be connected to the digital circuitry 220. The first level shifter 560 may be connected with the guard unit 520.

The first level shifter 560 may level-shift a signal received through the hybrid connector 510 and thus generate a level-shifted signal. The first level shifter 560 may level-shift a signal received through the digital circuitry 220 and thus generate the level-shifted signal.

The first level shifter 560 may provide the level-shifted signal to the digital circuitry 220. The first level shifter 560 may provide the level-shifted signal to the hybrid connector 510.

The first level shifter 560 may operate when the control signal activates a digital path (the path between the digital circuitry 220 and the hybrid connector 510).

The path determining unit 420-1 to 420-n including the above-stated functional structure may adaptively adjust the function or the number of the connectors for the hybrid chip 400. Thus, the hybrid chip 400 may increase an amount of the received or transmitted signal up to a capability of the analog circuitry 210 or the digital circuitry 220 according to a type of task.

Figure 6:
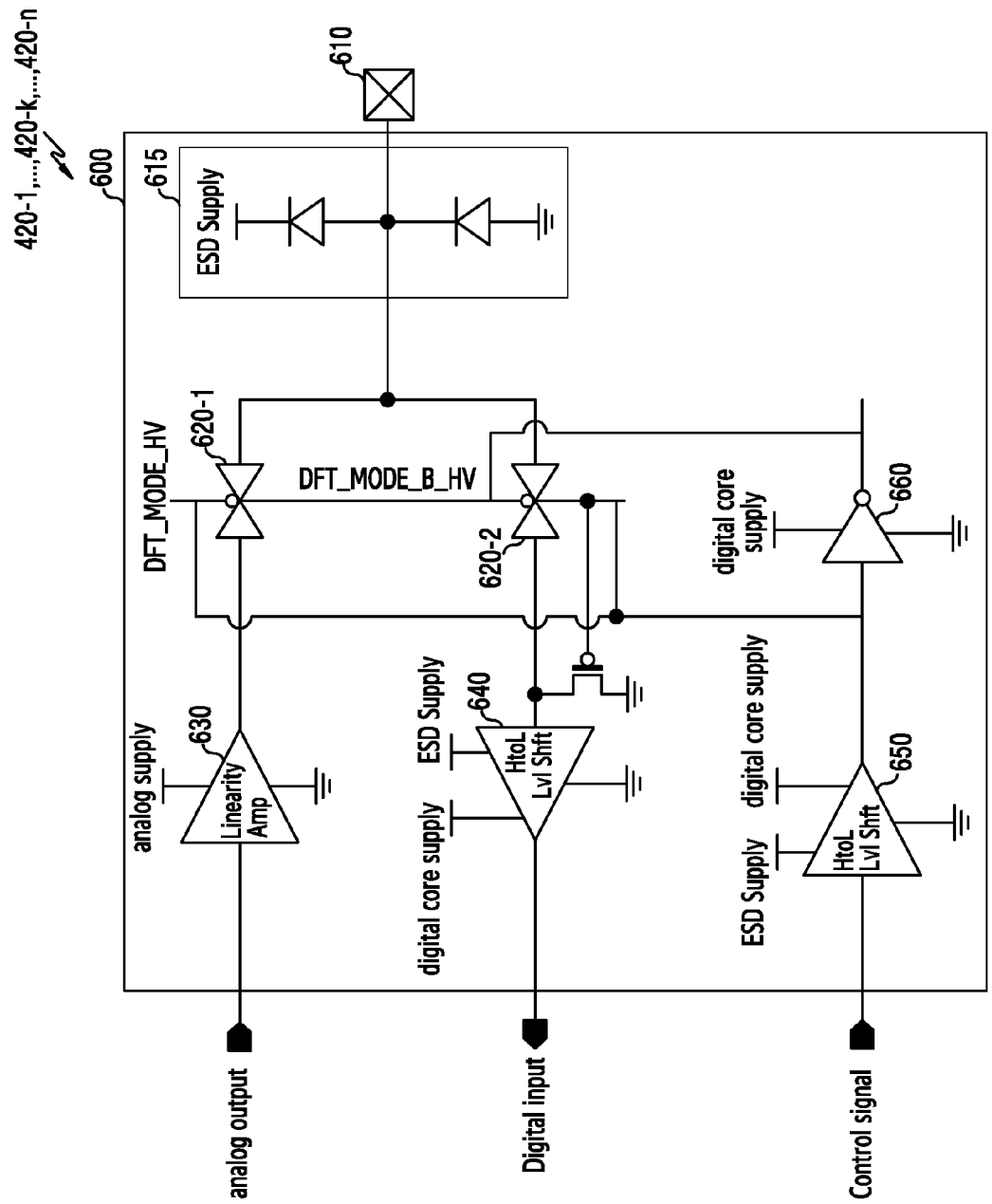
FIG. 6 is a block diagram of a path determining unit according to an embodiment of the present disclosure.

FIG. 6 is a block diagram of a path determining unit 600 according to an embodiment of the present disclosure.

Referring to FIG. 6, the path determining unit 600 and a hybrid connector 610 are shown. The path determining unit 600 may include a guard unit 615, an analog path switch 620-1, a digital path switch 620-2, a linear amplifier 630, a first high to low (HtoL) level shifter 640, a second HtoL level shifter 650, and an inverter 660.

The hybrid connector 610 may be connected with the guard unit 615.

The hybrid connector 610 may receive a signal from at least one electronic device and forward the received signal to analog circuitry or digital circuitry. The hybrid connector 610 may receive a signal from analog circuitry or digital circuitry and forward the signal to at least one electronic device.

The hybrid connector 610 may be operatively coupled with analog circuitry or digital circuitry according to a control signal received at the path determining unit 600.

The guard unit 615 may be connected to the hybrid connector 610. The guard unit 615 may be connected to the analog path switch 620-1. The guard unit 615 may be connected with the digital path switch 620-2.

The guard unit 615 may include a clamp diode including two diodes. One of the two diodes may be connected to an ESD supply, and the other diode may be connected to a ground.

The guard unit 615 may protect the path determining unit 600, analog circuitry, digital circuitry, and the hybrid connector 610.

The second HtoL level shifter 650 may be connected to the inverter 660. The second HtoL level shifter 650 may be connected to the analog path switch 620-1.

The second HtoL level shifter 650 may receive a control signal.

The second HtoL level shifter 650 may level-shift the received control signal and generate the level-shifted control signal. For example, the second HtoL level shifter 650 may level-shift a 5V control signal and thus generate a level-shifted control signal of 1.8V.

The second HtoL level shifter 650 may provide a level-shifted control signal to the analog path switch 620-1.

For example, when a level-shifted control signal is a digital "1," the level-shifted control signal may activate an analog path (a path from the hybrid connector 610 to an analog output). The second HtoL level shifter 650 may provide a level-shifted control signal to the analog path switch 620-1 (e.g., a transmission-gate switch) and thus activate the analog path.

For example, when a level-shifted control signal is a digital "0," the level-shifted control signal may deactivate the analog path. The second HtoL level shifter 650 may provide a level-shifted control signal to the analog path switch 620-1 and thus deactivate the analog path.

The second HtoL level shifter 650 may provide a level-shifted control signal to the inverter 660.

The inverter 660 may be connected to the second HtoL level shifter 650. The second HtoL level shifter 650 may be connected to the digital path switch 620-2 (e.g., a transmission-gate switch).

The inverter 660 may receive a level-shifted control signal.

The inverter 660 may invert a level-shifted control signal and thus generate an inverted control signal.

The inverter 660 may provide an inverted control signal to the digital path switch 620-2.

For example, the inverter 660 may invert a level-shifted control signal that is a digital "1" and thus generate an inverted control signal that is a digital "0." An inverted control signal that is a digital "0" may deactivate a digital path (a path from the hybrid connector 610 to a digital input). The inverter 660 may provide an inverted control signal to the digital path switch 620-2 and thus deactivate the digital path.

For example, the inverter 660 may invert a level-shifted control signal that is a digital "0" and thus generate an inverted control signal that is a digital "1." An inverted control signal that is a digital "1" may activate the digital path. The inverter 660 may provide an inverted control signal to the digital path switch 620-2 and thus activate the digital path.

The analog path switch 620-1 may be connected to the linear amplifier 630. The analog path switch 620-1 may be connected to the guard unit 615. The analog path switch 620-1 may be connected with the digital path switch 620-2.

The analog path switch 620-1 may be a device for activating or deactivating the analog path. For example, when a level-shifted control signal DFT_MODE_HV is a digital "1" and an inverted control signal DFT_MODE_B_HV is a digital "0," the analog path switch 620-1 may activate the analog path. For example, when a level-shifted control signal DFT_MODE_HV is a digital "0" and an inverted control signal DFT_MODE_B_HV is a digital "1," the analog path switch 620-1 may deactivate the analog path.

The digital path switch 620-2 may be connected with the first HtoL level shifter 640. The digital path switch 620-2 may be connected with the guard unit 615. The digital path switch 620-2 may be connected with the analog path switch 620-1.

The digital path switch 620-2 may be a device for activating or deactivating a digital path. For example, when an inverted control signal DFT_MODE_B_HV is a digital "1" and a level-shifted control signal DFT_MODE_HV is a digital "0," the digital path switch 620-2 may activate the digital path. For example, when an inverted control signal DFT_MODE_B_HV is a digital "0" and a level-shifted control signal DFT_MODE_HV is a digital "1," the digital path switch 620-2 may deactivate the digital path.

The analog path switch 620-1 and the digital path switch 620-2 may be embodied as a single switch. The analog path switch 620-1 and the digital path switch 620-2 may be referred to as an input unit.

The linear amplifier 630 may be connected to the analog path switch 620-1. The linear amplifier 630 may be operatively coupled with analog circuitry.

When an analog path is activated, the linear amplifier 630 may operate. The linear amplifier 630 may amplify an analog output and generate an amplified analog output. The linear amplifier 630 may provide an amplified analog output to the hybrid connector 610 through an analog path.

The first HtoL level shifter 640 may be connected to the digital path switch 620-2. The first HtoL level shifter 640 may be operatively coupled with digital circuitry.

When a digital path is activated, the first HtoL level shifter 640 may operate. The first HtoL level shifter 640 may level-shift a digital output and generate a level-shifted digital output. The first HtoL level shifter 640 may provide a level-shifted digital output to the hybrid connector 610 through a digital path.

FIG. 6 illustrates that a signal is output from analog circuitry and another signal is input to digital circuitry. However, the embodiment shown in FIG. 6 is for illustration purposes only. Other embodiments may be used without departing from the scope and spirit of the present disclosure. The hybrid chip 400 may be applied when a signal is input to analog circuitry and a signal is input to digital circuitry, when analog circuitry outputs a signal and digital circuitry outputs a signal, and when a signal is input to analog circuitry and digital circuitry outputs a signal.

Figure 7:
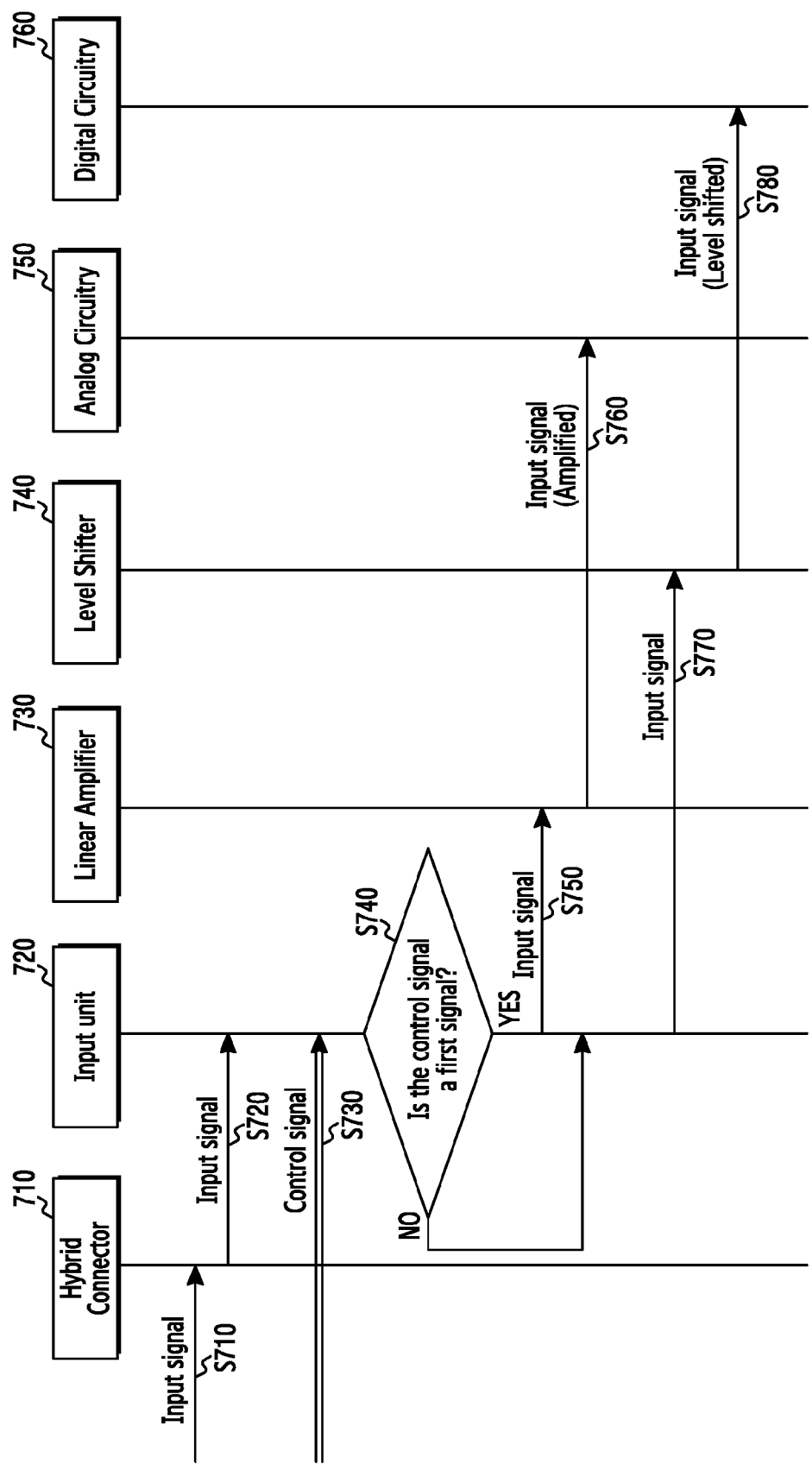
FIG. 7 is a signal flow diagram of a hybrid chip according to an embodiment of the present disclosure.

FIG. 7 is a signal flow diagram of a hybrid chip according to an embodiment of the present disclosure. The signal flow may take place in the hybrid chip 200 of FIG. 2.

Referring to FIG. 7, in S710, a hybrid connector 710 may receive an input signal from at least one electronic device. The input signal may be one of a signal for analog circuitry and a signal for digital circuitry.

In S720, the hybrid connector 710 may provide the input signal to an input unit 720. The input unit 720 may receive the input signal from the hybrid connector 710. The input unit 720 may include the analog path switch 620-1 and digital path switch 620-2 of FIG. 6.

In S730, the input unit 720 may receive a control signal. In an embodiment of the present disclosure, the control signal may be received from a controller of a user equipment including the hybrid chip 200. The control signal may be received based on a user input for a user equipment including the hybrid chip 200.

According to an embodiment of the present disclosure, S720 and S730 may be performed at the same time or in reverse order.

In S740, the input unit 720 may determine whether the received control signal is a first signal. The first signal may activate a path (hereinafter, referred to as an analog path) between analog circuitry 750 and the hybrid connector 710.

When the received control signal is the first signal, the input unit 720 may send the input signal to a linear amplifier 730 in S750. The linear amplifier 730 may receive the input signal from the input unit 720.

In S760, the linear amplifier 730 may amplify the input signal and thus generate an amplified input signal. The linear amplifier 730 may provide an amplified input signal to the analog circuitry 750. The analog circuitry 750 may receive the amplified input signal.

When the received control signal is not the first signal, the input unit 720 may send the input signal to a level shifter 740 in S770. The level shifter 740 may receive the input signal from the input unit 720.

In S780, the level shifter 740 may level-shift the input signal and thus generate a level-shifted input signal. The level shifter 740 may provide the level-shifted input signal to the digital circuitry 760. The digital circuitry 760 may receive the level-shifted input signal.

As shown in FIG. 7, a hybrid chip including a hybrid connector 710, a switching unit, and a path determining unit may provide a signal received through one hybrid connector to analog circuitry or digital circuitry according to a control signal. Thus, the hybrid chip may maximize usability of the analog circuitry and/or the digital circuitry.

Figure 8:
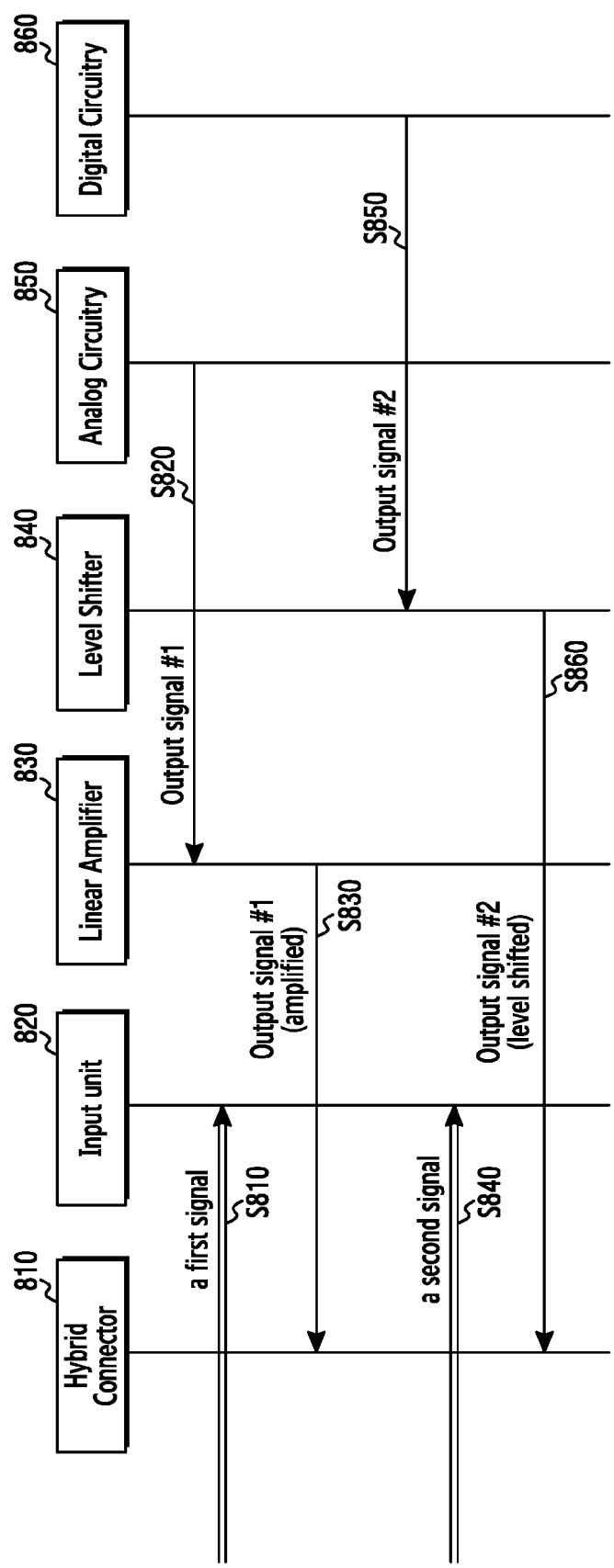
FIG. 8 is a signal flow diagram of a hybrid chip according to an embodiment of the present disclosure.

FIG. 8 is a signal flow diagram of a hybrid chip. The signal flow may take place in the hybrid chip 200 of FIG. 2.

Referring to FIG. 8, in S810, an input unit 820 may receive a first signal. The first signal may activate a path (hereafter, referred to as an analog path) from a hybrid connector 810 to analog circuitry 850.

In S820, the analog circuitry 850 may send a first output signal to a linear amplifier 830. Since the analog path is activated in S810, the linear amplifier 830 may receive the first input signal from the analog circuitry 850.

In S830, the linear amplifier 830 may amplify the first output signal and thus generate an amplified first output signal. The linear amplifier 830 may provide the amplified first output signal to the hybrid connector 810.

The hybrid connector 810 may provide the amplified first output signal to an electronic device.

In S840, the input unit 820 may receive a second signal. The second signal may activate a path (hereafter, referred to as a digital path) from a hybrid connector 810 to the digital circuitry 810.

In S850, the digital circuitry 860 may send a second output signal to a level shifter 840. Since the digital path is activated in S840, the level shifter 840 may receive the second input signal from the digital circuitry 860.

In S860, the level shifter 840 may level-shift the second output signal and thus generate a level-shifted second output signal. The level shifter 840 may provide the level-shifted second output signal to the hybrid connector 810.

The hybrid connector 810 may provide the level-shifted second output signal to the electronic device.

As shown in FIG. 8, a hybrid chip including the hybrid connector 810, a switching unit, and a path determining unit may provide an electronic device with a signal generated in analog circuitry or digital circuitry through one hybrid connector according to a control signal. Thus, the hybrid chip may maximize usability of the analog circuitry and/or the digital circuitry.

The above-described methods according to embodiments of the present disclosure may be implemented in software, firmware, hardware, or in a combination thereof.

As for software, a non-transient computer-readable storage medium storing one or more programs (software modules) may be provided. One or more programs stored in a non-transient computer-readable storage medium may be configured for execution by one or more processors of an electronic device. One or more programs may include instructions for controlling an electronic device to execute the methods according to an embodiment of the present disclosure.

Such a program (software module, software) may be stored to a random access memory (RAM), a non-volatile memory including a flash memory, a read only memory (ROM), an electrically erasable programmable ROM (EEPROM), a magnetic disc storage device, a compact disk (CD)-ROM, digital versatile disks (DVDs) or other optical storage devices, and a magnetic cassette. Alternatively, programs may be stored to a memory combining part or all of the recording media. A plurality of memories may be employed.

Programs may be stored in an attachable storage device accessible via a communication network such as the Internet, an Intranet, a local area network (LAN), a wireless LAN (WLAN), a storage area network (SAN), or a combination of these communication networks. A storage device may access an electronic device through an external port. A separate storage device may access an electronic device over a communication network.

In an embodiment of the present disclosure, the elements included in the present disclosure are expressed in a singular or plural form. However, a singular or plural expression is appropriately selected according to a proposed situation for the convenience of explanation and the present disclosure is not limited to a single element or a plurality of elements. The elements expressed in the plural form may be configured as a single element and the elements expressed in the singular form may be configured as a plurality of elements.

While the present disclosure has been shown and described with reference to certain embodiments thereof, it will be understood by those skilled in the art that various changes in form and details may be made therein without departing from the scope and spirit of the present disclosure as defined by the appended claims and their equivalents.

What is claimed is:

1. An integrated circuit (IC), comprising:
analog circuitry;
digital circuitry;
at least one first connector;
at least one second connector operatively coupled with the analog circuitry;
at least one third connector operatively coupled with the digital circuitry; and
a switching unit operatively coupled with the at least one first connector and configured to:
if a first signal is received, couple the analog circuitry to the at least one first connector, and
if a second signal is received, couple the digital circuitry to the at least one first connector,
wherein the analog circuitry is configured to receive at least one first analog signal and at least one second analog signal, and
wherein, if the switching unit receives the first signal, the at least one first analog signal is received from at least one electronic device through the at least one first connector, and the at least one second analog signal is received from the at least one electronic device through the at least one second connector.

2. The IC of claim 1, wherein the digital circuitry is configured to receive at least one first digital signal and at least one second digital signal, wherein
if the switching unit receives the second signal, the at least one first digital signal is received from at least one electronic device through the at least one first connector, and
the at least one second digital signal is received from the at least one electronic device through the at least one third connector.

3. The IC of claim 2, wherein the analog circuitry is further configured to send at least one third analog signal and at least one fourth analog signal, wherein
if the switching unit receives the first signal, the at least one third analog signal is transmitted to the at least one electronic device through the at least one first connector, and
the at least one fourth analog signal is received from the at least one electronic device through the at least one second connector.

4. The IC of claim 3, wherein the digital circuitry is further configured to send at least one third digital signal and at least one fourth digital signal, wherein
if the switching unit receives the second signal, the at least one third digital signal is transmitted to the at least one electronic device through the at least one first connector, and
the at least one fourth digital signal is transmitted to the at least one electronic device through the at least one third connector.

5. The IC of claim 1, wherein the switching unit comprises:
a plurality of path determining units,
wherein the path determining units each are connected to an analog path and a digital path, wherein
if the first signal is received, the path determining units operatively couple one of the analog circuitry and the at least one first connector through the analog path, and
if the second signal is received, the path determining units operatively couple one of the digital circuitry and the at least one first connector through the digital path.

6. The IC of claim 5, wherein the path determining units each further comprise:
a linear amplifier connected to the analog circuitry and the analog path; and
a first level shifter connected to the digital circuitry and the digital path.

7. The IC of claim 6, wherein the at least one first connector comprises:
a fourth connector,
wherein
if a first path determining unit of the path determining units receives the first signal, the first analog signal is generated by amplifying the first signal through the linear amplifier, and
the first signal is received at the first path determining unit from an electronic device through the fourth connector.

8. The IC of claim 7, wherein the at least one first connector comprises:
a fifth connector,
wherein the digital circuitry is configured to receive a first digital signal, wherein
if a second path determining unit of the path determining units receives the second signal, the first digital signal is generated by shifting the second input signal through the first level shifter, and
the second input signal is received at the second path determining unit from the electronic device through the fifth connector.

9. The IC of claim 8, wherein the at least one first connector comprises:
a sixth connector,
wherein the analog circuitry is further configured to send a second analog signal,
wherein the linear amplifier is configured to generate a first output signal by amplifying the second analog signal, and
if a third path determining unit of the path determining units receives the first signal, the first output signal is transmitted to the at least one electronic device through the sixth connector.

10. The IC of claim 9, wherein the at least one first connector comprises:
a seventh connector,
wherein the digital circuitry is further configured to send a second digital signal,
wherein the first level shifter is configured to generate a second output signal by shifting the second digital signal, and
if a fourth path determining unit of the path determining units receives the second signal, the second output signal is transmitted to the at least one electronic device through the seventh connector.

11. The IC of claim 6, wherein the path determining units each further comprise:
a second level shifter; and
an inverter operatively coupled with the second level shifter.

12. The IC of claim 11, wherein the second level shifter is further configured to receive the first signal, wherein
if the first signal is received, the second level shifter shifts the first signal and generates the shifted first signal, the inverter generates a third signal by inverting a polarity of the shifted first signal,
wherein the shifted first signal activates the analog path, and
the third signal deactivates the digital path.

13. The IC of claim 12, wherein the second level shifter is configured to receive the second signal, wherein
if the second signal is received, the second level shifter shifts the second signal and generates the shifted second signal, the inverter generates a fourth signal by inverting a polarity of the shifted second signal,
wherein the shifted second signal activates the digital path, and
wherein the fourth signal deactivates the analog path.

14. The IC of claim 6, wherein the path determining units each further comprise:
a guard unit operatively coupled with one of the at least one first connector.

15. The IC of claim 14, wherein the guard unit is configured to block static electricity from flowing in the analog path or the digital path.

16. The IC of claim 1, wherein the digital circuitry is operatively coupled with the analog circuitry and is configured to generate a signal for controlling the analog circuitry,
wherein the first signal is a control signal for activating the analog circuitry, and
wherein the second signal is a control signal for activating the digital circuitry.

17. The IC of claim 1, wherein the first signal is received to generate a signal for an apparatus comprising the IC, and
wherein the second signal is received to check for an error of the IC.

18. A method of manufacturing an integrated circuit (IC), comprising:
forming analog circuitry as part of a wafer or package;
forming digital circuitry as part of the wafer or package;
forming at least one first connector as part of the wafer or package;
forming at least one second connector operatively coupled with the analog circuitry as part of the wafer or package;
forming at least one third connector operatively coupled with the digital circuitry as part of the wafer or package; and
forming a switching unit operatively coupled with the at least one first connector and configured to:
if a first signal is received, couple the analog circuitry to the at least one first connector, and
if a second signal is received, couple the digital circuitry to the at least one first connector,
wherein the analog circuitry is configured to receive at least one first analog signal and at least one second analog signal, and
wherein, if the switching unit receives the first signal, the at least one first analog signal is received from at least one electronic device through the at least one first connector, and the at least one second analog signal is received from the at least one electronic device through the at least one second connector.

* * * * *